United States Patent
Huang (10) Patent No.: US 11,621,303 B2
(45) Date of Patent: Apr. 4, 2023

(54) ORGANIC LIGHT-EMITTING DIODE DISPLAY PANEL AND DISPLAY APPARATUS

(71) Applicant: SeeYA Optronics Co., Ltd., Shanghai (CN)

(72) Inventor: Zhongshou Huang, Shanghai (CN)

(73) Assignee: SeeYA Optronics Co., Ltd., Shanghai (CN)

( * ) Notice: Subject to any disclaimer, the term of this patent is extended or adjusted under 35 U.S.C. 154(b) by 135 days.

(21) Appl. No.: 17/158,248

(22) Filed: Jan. 26, 2021

(65) Prior Publication Data

US 2022/0085119 A1    Mar. 17, 2022

(30) Foreign Application Priority Data

Sep. 15, 2020   (CN) .......................... 202010969490.1

(51) Int. Cl.
*H01L 27/32* (2006.01)

(52) U.S. Cl.
CPC ........ *H01L 27/3218* (2013.01); *H01L 27/322* (2013.01); *H01L 27/3213* (2013.01)

(58) Field of Classification Search
CPC ...................... H01L 27/3218; H01L 27/3213; H01L 27/322
See application file for complete search history.

(56) References Cited

U.S. PATENT DOCUMENTS

2022/0115629 A1* 4/2022 Suzuki ............... G02B 19/0066

FOREIGN PATENT DOCUMENTS

KR         20180045968 A  *  5/2018

* cited by examiner

*Primary Examiner* — Anne M Hines
*Assistant Examiner* — Jose M Diaz
(74) *Attorney, Agent, or Firm* — W&G Law Group (57) ABSTRACT

An OLED display panel includes a substrate and a pixel array on the substrate, each pixel includes a group of subpixels, and each subpixel includes a light-emitting element and a color filter element. Among the color filter elements in the subpixel group, there is a first color filter element which is substantially transparent for light of the longest wavelength. Except a periphery of the pixel array, every M first color filter elements from M adjacent pixels abut against each other to form a seamless color filter block, where $M \geq 2$.

9 Claims, 10 Drawing Sheets

FIG. 1

(Prior Art)

(Prior art)

ORGANIC LIGHT-EMITTING DIODE DISPLAY PANEL AND DISPLAY APPARATUS

CROSS-REFERENCE TO RELATED APPLICATIONS

The present application claims the benefit of priority of Chinese Patent Application No. 202010969490.1, filed on Sep. 15, 2020, the entire contents of which are incorporated herein by reference.

TECHNICAL FIELD

The present disclosure relates to the field of display panel technologies, and in particular, to an organic light-emitting diode display panel and a display apparatus comprising thereof.

BACKGROUND

After 6.5 million years of evolution, the human vision system has been naturally optimized to adapt to hunting and farming activities on the earth. For example, the spatial distribution of brightness is detected by hundreds of millions of light-sensitive optic nerve cells that are densely distributed on a retina. Colors of images are recognized by three types of cone cells on the retina, which are sensitive to red, green, and blue light, respectively. Contrast enhancement of images and tracking of moving objects are realized by performing differential processing of spatial distribution on signal intensity acquired by the optic nerve cells, e.g., the well-known Mach effect for enhancing edge contrast.

Almost all of electronic cameras and electronic displays developed in recent 100 years have been designed and manufactured to mimic the functionalities or meet the requirements of human visual system. Therefore, various characteristic parameters of the electronic camera or displays, such as color, brightness, image refreshing frequency, spatial resolution, viewing angle, response speed, are ideally constructed to accommodate the structure and characteristics of the human vision system. However, a picture element, such as a pixel in an electronic display, is not formed by a single light-emitting point source or a single reflection point source that emits or reflects light in different colors, like what a real object in nature such as an animal or a plant does. Instead, such a pixel is formed by three subpixels, which abut against each other and emit or reflect red, green and blue light, respectively. Two types of the electronic displays are developed so far: self-illumination display, and reflective display. They both use RGB subpixels to produce color images. The retina of human eyes contains nearly 125 million rod cells and nearly 7 million cone cells. The cone cells are densely distributed near the macula area that is most sensitive area in the retina, which mainly functions to collect color signals with a relatively higher spatial resolution. The rod cells mainly function to acquire brightness signals with a relatively lower spatial resolution. Analysis of retinal slices by a scanning electron microscopy (SEM) has revealed that the cone cells and the rod cells generally have cross-sectional dimensions in a range of 3 μm to 10 μm, and the rod cells are smaller than the cone cells. Each cone cell is connected with an optic nerve linking to a vision processing region of human brain. However, each rod cell is further connected with multiple rod cells nearby to perform primary spatial correlation operations on images, and the results are then output to the vision processing portion of the human brain. Therefore, although there are a large number of rod cells with slightly smaller dimensions, the spatial resolution of the rod cells is lower than that of the cone cells.

In the electronic displays, dimension and quantity of subpixel in one color can be different from that of the subpixels in other colors. For example, since the human retina is most sensitive to green light in the range of 520 nm to 580 nm, more green subpixels used in the electronic displays will result in less power consumption and longer lifetime. As an alternative approach to reduce power consumption, W (white) subpixels, which output white light, are added into the pixel array of a smart phone display screen or a television display screen. A typical and most well-known example is Bayer color filter (CF) array, where red, green, and blue color filters and associated subpixels are arranged in a square grid matrix with a quantity ratio as: green pixels:red pixels:blue pixels equal to 50%:25%:25%. In another Bayer arrangement, the number of the blue subpixels is merely about one eighth of the total number of the subpixels, which imitates the human retina's low resolution for blue images. In other words, it will be a waste if one-third or one-fourth of the total subpixels are blue subpixels, and it is therefore preferable to assign more space of the display array to the green or red subpixels for better image resolution and brightness.

Fabricated by most advanced semiconductor technology, the displays and cameras in recent years have exceeded performance limits of the human eyes in some aspects, or even approached limits of some physical laws. For instance, an image sensor or a display panel with submicron subpixel can be readily produced with mature deep ultraviolet light in lithography, however image detail in submicron meter is theoretically impossible to be recognized or resolved by a visible light wave. Optical diffraction becomes a significant obstacle in this case.

In particular, 4K camera chips with ultra-high-resolution in single-lens reflex cameras and mobile phone cameras have been successfully developed and widely used in recent years, where the optical diffraction phenomenon has been firstly concerned and studied in the field of imaging technologies. On the display technology side, micro-display, which is mainly adopted in augmented reality (AR) or virtual reality (VR) applications, comprises subpixels in a dimension comparable to the wavelength of visible light, in order to obtain high resolution image on a miniaturized display panel. For example, micro-display formed by superimposing an organic light-emitting diode (OLED hereinafter) on a silicon chip, with subpixel size scaled down to 1 μm or even smaller, can be readily manufactured by using mature integrated circuit foundry processes, and the miniaturization trend will continue in the foreseeable future. Unfortunately, the detrimental effects of the optical diffraction in the micro-display associated with the miniaturization trend has not been well studied and fewer improvement in device structure is proposed.

The diffraction effect occurring on the image sensor can be corrected to some extent through subsequent image processing. For example, a point spread function of the diffraction effect of an optical waveform can be obtained in advance through measurement or computer simulation performed on an existing device, and then an input image without diffraction interference can be reconstructed by using an algorithm such as deconvolution. In other words, the structure of the image sensor is treated as a spatial light modulator, including functions for diffracting, reflecting, refracting and absorbing, and then an inverse operation is performed on the obtained image to retrieve the original input image. However, since the display provides a twodimensional optical image for direct and real-time viewing, all the diffracted light components will enter the human eyes in real time together with a normal optical image, and therefore are unable to be separated or corrected.

Figure 1:
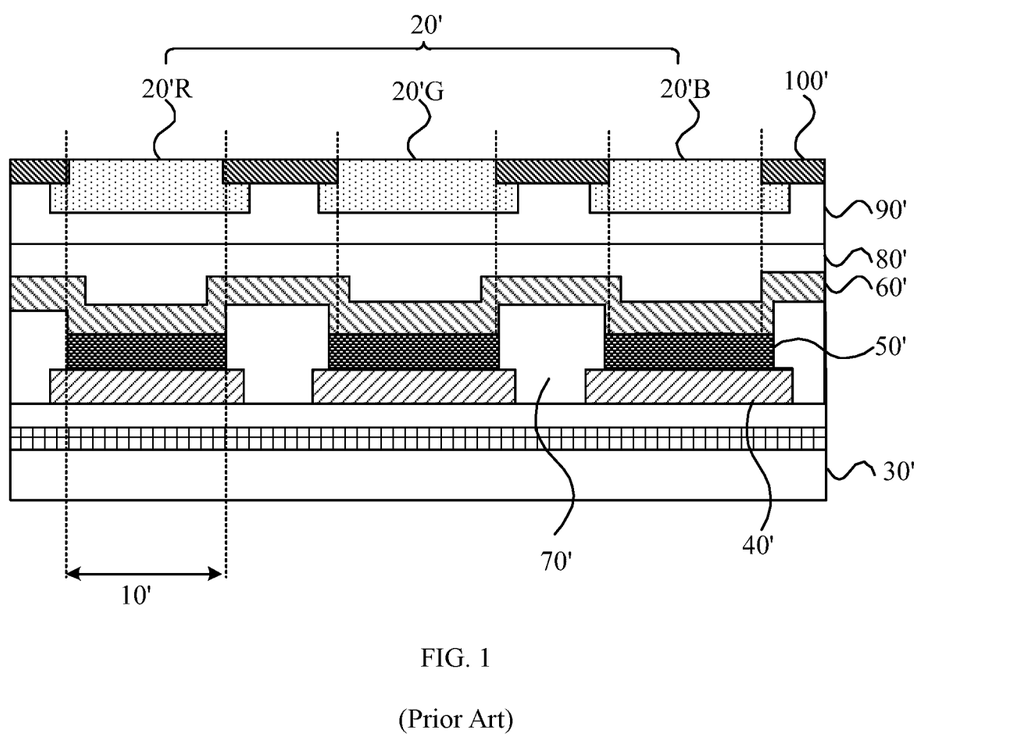
FIG. 1 illustrates a cross-sectional view of a pixel in an OLED display panel in the related art.
Figure 2:
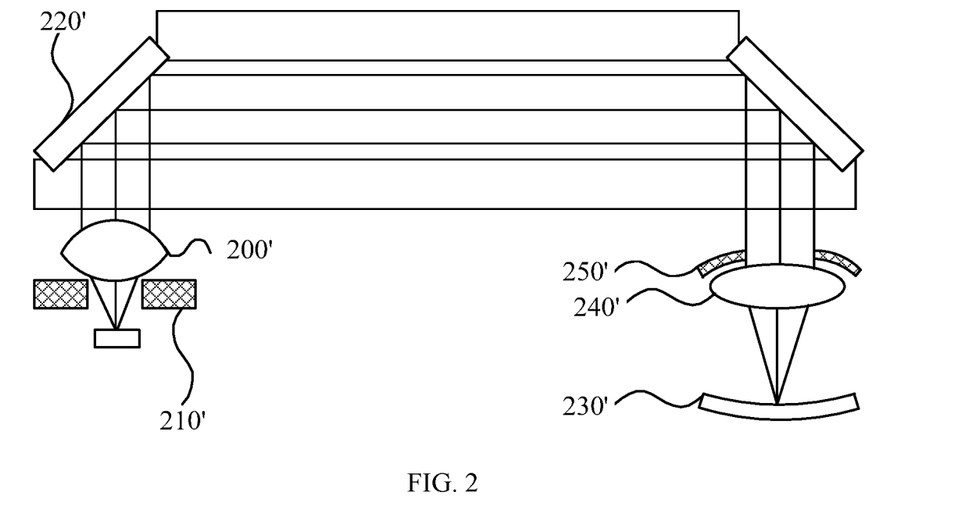
FIG. 2 illustrates an optical system in an AR or VR glasses comprising an OLED display panel as illustrated in FIG. 1.

FIG. 1 illustrates a cross-sectional view of a pixel in an OLED display panel in the related art, FIG. 2 illustrates an optical system in an AR or VR glasses comprising an OLED display panel as illustrated in FIG. 1. Referring to FIG. 1, which is a micro optical system, a pixel includes three subpixels, R, G, and B, and each of the three subpixels includes an OLED 10' and a color filter 20'. For example, white light is emitted by the OLED 10' and filtered by a red filter 20'R to allow only red light to pass through. A black matrix 30' is arranged around the red filter 20'R to block or absorb light emitted in large oblique angle. In other words, an opening of the black matrix 30' defines an output window or an aperture for the light emitted from the OLED 10'. According to the principle of diffractive optics, any slit or aperture which hinders propagation of the light waveform will cause wavefront interference and generate a transversely propagating diffractive waveform behind the slit or the aperture. In addition, diffraction becomes more severe for smaller slit or aperture and for longer wavelength light, so that the diffraction occurring in the blue and green subpixels are less severe than that in the red subpixel. Further referring to the optical system illustrated in FIG. 2, which is a macro optical system comparing to the micro optical system described above, several optical components including a focusing lens 200', a diaphragm 210' of the lens system and a reflector 220' are adopted to transmit an optical image from the OLED display to human retina 230'. In other circumstances where a slim and light weight AR glasses is essential, the optical images may be transmitted through an optical waveguide, such as a bundled optical fibers or a transparent sheet made of high refractive index material. In any of the above circumstances, for the purpose of miniaturization and lightweight of the optical system, a size of the focusing lens 200' and a size of the diaphragm 210' may be smaller than a size of the eye iris 250'. Optical diffraction may occur at a circular aperture of the diaphragm 210' as well.

Figure 3:
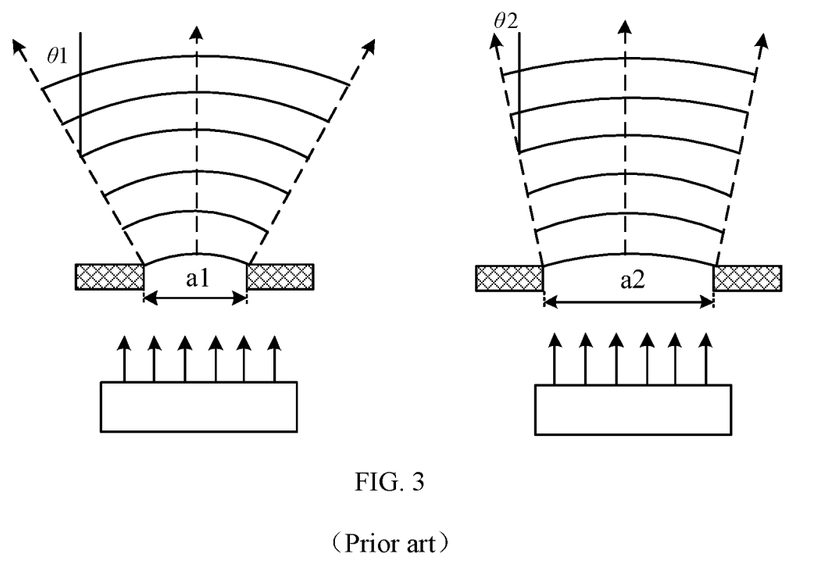
FIG. 3 illustrates an aperture size dependence of an optical diffraction in the related art.

The optical diffractions at micro level and macro level as described above occur due to the same root cause that the light propagation is hindered by the aperture of the black matrix or the diaphragm, and therefore both follow the same diffraction law. One of the diffraction laws is illustrated in FIG. 3, where an aperture a1 is smaller than an aperture a2, and the resulting diffraction phenomenon measured by light spread angles satisfies: $\theta_1 > \theta_2$. For the optical diffractions, a diffraction occurring when a point light source passes through a circular aperture is referred to as Fresnel circular aperture diffraction, and a diffraction occurring when a parallel light beam passes through a circular aperture is referred to as Fraunhofer circular aperture diffraction. The light-emitting source in the OLED display panel is an array formed by pixelated planar light sources in a small area. Strictly speaking, neither the diffraction by an aperture of the black matrix nor the diffraction by the diaphragm of an imaging lens of the display panel are the Fraunhofer diffraction. However, considering a spatial angular distribution of the light emitted by the OLED 10', i.e., the fact that a light-emitting intensity in a normal direction of the OLED 10' is the highest, the diffraction of the display panel can be approximately simulated based on the Fraunhofer diffraction theory.

According to the Fraunhofer diffraction theory, a spread angle of a bright spot, i.e., an Airy disc, at a center of the diffraction pattern can be expressed by the following equation:

$$\theta = \arctan\left(\frac{1.22\lambda}{a}\right).$$

In the above equation, $\lambda$ denotes a wavelength of the light, and a denotes a light transmission aperture. As defined in this equation, when the spread angle of the Airy disc is relatively small, the spread angle of the Airy disc is approximately proportional to the wavelength, and is approximately inversely proportional to the light transmission aperture. For example, when a black matrix of the subpixel has an opening diameter of 2 μm, green light with a wavelength of 0.55 μm has a spread angle of 19° after diffracted, which results in serious cross talk or color mixing, and red light with a wavelength of 0.7 μm has a 25° spread angle of transverse diffusion after diffracted. Assuming that the subpixel has a width of 4 μm, that is, a width of the black matrix between adjacent subpixels of different colors is 1 μm, the light emitted from a subpixel of a color and propagating at a large angle will be mixed with the light emitted from an adjacent subpixel of another color after a vertical propagating distance of the light propagating at the large angle reaches 2 μm. Therefore, in the OLED display panel, when the size of the subpixel is 3 μm or less, the transverse light diffusion resulting from the diffraction will cause serious crosstalk of colors, resulting in decrease in the color contrast and serious degradation of a color gamut of the display screen.

As shown in FIG. 1, each of the pixels manufactured on a silicon substrate 30' includes a red subpixel 10'R, a green subpixel 10'G and a blue subpixel 10'B that are arranged on the silicon substrate 30'. Each of the subpixels includes: a first electrode 40' typically used as an anode of an organic light emitting diode (OLED); a pixel definition layer 70' configured to block lateral charge diffusion between adjacent subpixels; an OLED functional layer 50' typically formed by stacking up a plurality of thin films of different functions; a second electrode 60' typically made of transparent electrode used as a cathode of the OLED; an encapsulation layer 80' typically formed by stacking up a plurality of layers of silicon nitride and silicon oxide alternatively, and configured to protect the OLED films against external moisture and oxygen; a planarization layer 90' configured to planarize an uneven surface of the device to reduce a deviation of an optical path of light passing through a color film and to eliminate light scattering caused by any unevenness between a cover glass and an OLED display screen; a color filter 20'; and a black matrix 100' configured to absorb light having a large angle and therefore to prevent the OLED display from optically cross-talk and color mixing between the adjacent subpixels. The white lights, emitted from OLEDs of the three subpixels on the silicon substrate, are filtered by the respective color filters 20' so that light of three colors, which are R, G, and B, are emitted from the OLED display panel. The black matrix is designed precisely to block large angle light based on the theory of geometrical optics, wherein all light photons are propagated along straight lines in a uniform medium. However, the black matrix with its opening close to the light wavelength, will cause the Fraunhofer diffraction. According to the above-described angle equation of a zero-order diffraction disc, i.e., the Airy disc, the size of the diffraction disc increases with the increase of the wavelength and with the decrease of the opening size. Therefore, in the pixel structure shown in FIG. 1, the diffraction effect of the red subpixel is most significant, and the red light from the red pixel tends to diffuse laterally and mix with the light from the adjacent pixel. In addition, in the relater art, each subpixel is a rectangular shape having long side and short side, diffraction and its associated color mixing and crosstalk phenomenon will occur most serious in the short side direction, since the black matrix opening is smaller in the short side.

SUMMARY

At least one of embodiments of the present disclosure provides an OLED display panel and a display apparatus to reduce detrimental effects of optical diffraction and improve image resolution and color gamut of the OLED display panel.

A first aspect of the present disclosure provides an OLED display panel including: a substrate; and a plurality of pixels forming a pixel array which is located on the substrate, each pixel includes a group of subpixels, and each subpixel includes a light-emitting element and a color filter element covering the light-emitting element. Each color filter element is made approximately transparent for a certain color light. Each subpixel group comprises N kinds of color filter elements that are substantially transparent for light of N colors, respectively, where N≥2, and each subpixel group includes a first color filter element among the N kinds of color filter elements. Except a periphery of the pixel array, every M color filter elements of the first color filter element are abutted each other to form a seamless color filter block, where M≥2.

A second aspect of the present disclosure provides an OLED display panel according to the first aspect, M color filter elements that are transparent in the first color light in the adjacent pixels are abutted together without black matrix between them.

Therefore, the effective light transmission aperture in the subpixel with the first color filter element increases, and the optical diffraction and its detrimental effects in image resolution and color gamut decrease.

DESCRIPTION OF EMBODIMENTS

The present disclosure is described below in further detail with reference to the accompanying drawings and embodiments. It should be understood that the specific embodiments described herein are merely intended to explain the present disclosure, rather than limiting the present disclosure. In addition, it should also be noted that, for ease of description, only a partial structure related to the present disclosure, rather than the entire structure thereof, is shown in the accompanying drawings.

Figure 4:
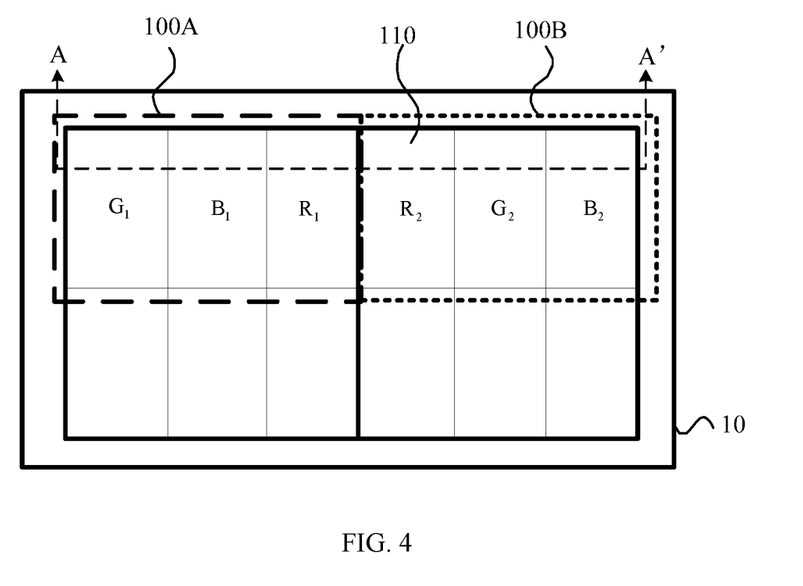
FIG. 4 illustrates a pixel layout in an OLED display panel according to an embodiment of the present disclosure.
Figure 5:
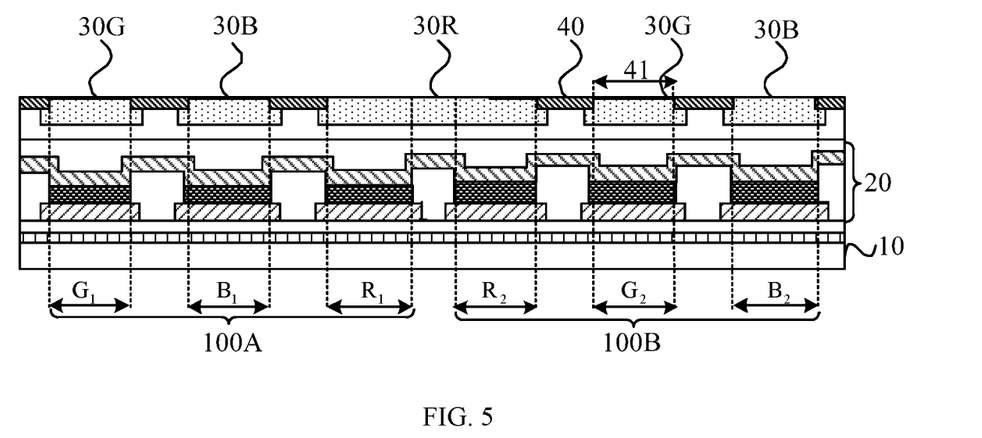
FIG. 5 shows a cross-sectional view of the pixel along line A-A' as shown in FIG. 4.

In view of the technical problems as described above, the present disclosure discloses an OLED display panel in various embodiments. FIG. 4 illustrates a pixel layout in an OLED display panel according to an embodiment of the present disclosure, and FIG. 5 shows a cross-sectional view of the pixel along line A-A' as shown in FIG. 4. As shown in FIGS. 4 and 5, the OLED display panel includes a substrate 10 and a plurality of pixels 100A and 100B forming pixel array which is located on the substrate 10. Each pixel 100A or 100B includes a group of subpixels 110, each subpixel 110 includes a light-emitting element 20 and a color filter element covering the light-emitting element 20. Each color filter element is made approximately transparent for light of a certain color. Subpixels 110 of the plurality of pixels 100A and 100B include N kinds of color filter elements that are transparent for light of N different colors, respectively, where N≥2. FIG. 5 illustrates an example in which each subpixel group includes a first color filter element among the N kinds of the color filter elements, and except a periphery of the pixel array, every M color filter elements of the first color filter element are abutted against each other to form a seamless color filter block, where M≥2.

For convenience of description, color filter element or color filter block that is made transparent for light of a first color is hereinafter referred to as color filter element or color filter block of the first color, or first color filter element or first color filter block. For example, color filter elements that are transparent for light of the first color are hereinafter referred to as color filter elements of the first color, color filter elements that are made transparent for light of N colors are hereinafter referred to as color filter elements of the N colors, color filter block that are made transparent for light of a first color is hereinafter referred to as color filter block of the first color, and color filter blocks that are made transparent for light of K colors are hereinafter referred to as color filter blocks of the K colors. For example, a color filter element or block that is made transparent for light of a red color may also be referred to as a red color filter element or a red color filter block hereinafter; and color filter elements or blocks that are made transparent for light of other colors are hereinafter referred in a similar manner.

FIGS. 4 and 5 exemplarily illustrate that each pixel includes a red subpixel, a green subpixel, and a blue subpixel; in the pixel 100A, the red subpixel is denoted by $R_1$, the green subpixel is denoted by $G_1$, and the blue subpixel is denoted by $B_1$; and in the pixel 100B, the red subpixel is denoted by $R_2$, the green subpixel is denoted by $G_2$, and the blue subpixel is denoted by $B_2$. Further, a red color filter element 30R is provided on the light-emitting element in the red subpixel, a blue color filter element 30B is provided on the light-emitting element in the blue subpixel, and a green color filter element 30G is provided on the light-emitting element in the green subpixel. Furthermore, color filter elements of red subpixels of two adjacent pixels 100A and 100B are merged together. In this way, on the one hand, an effective aperture ratio of the red subpixels of two adjacent pixels can be improved, and on the other hand, a light transmission aperture of the red subpixel is increased by at least one fold, which can effectively reduce the optical diffraction occurring in the red subpixel, thereby protecting the adjacent pixels from being affected by diffracted light of the red subpixel.

It should be noted that FIGS. 4 and 5 exemplarily illustrate that the color filter elements of the red subpixels in the adjacent pixels are merged together. Although merged together, the color filter elements of the red subpixels in the adjacent pixels are different from each other in a driving voltage of the light-emitting element. Therefore, the red subpixels in different pixels can emit light of different intensities according to their respective driving voltage signals, so that the red subpixels in different pixels have different brightness and lightness while subpixels that include different light-emitting elements sharing a color filter block of one color emit light of the same color, thus achieving the desired display effect.

Since a minimum width of a black matrix between adjacent color filter elements depends on an accuracy of a patterning process of the color filter elements, including an alignment accuracy of an exposed mask, collimation of the exposure light and an accuracy at which patterns of the color filter elements are developed. For the color filter elements with a thickness close to 1 µm, the minimum width is about 1 µm. Therefore, when the minimum width of one subpixel is close to 4 µm, the aperture ratio of the subpixel is only about 50%. If no black matrix is present between the adjacent pixels, i.e., the red subpixel $R_1$ of the pixel 100A and the red subpixel $R_2$ of the pixel 100B sharing a seamless color filter block, then the effective aperture ratio of the red subpixel is increased to 75%.

It should be noted that, in the embodiment of the present disclosure, the pixels may be the same as or different from each other in terms of the number, the color and the arrangement of the subpixels.

Further, FIGS. 4 and 5 exemplarily illustrate that the color filter elements of the first color are red color filter elements, and every two red color filter elements are abutted together to form a seamless color filter block without black matrix between them. In addition, there could be multiple seamless color filter blocks in different colors. For example, the first color is a red color, the second color is a green color, every two red color filter elements are abutted together to form a seamless first color filter block, and every two green color filter elements are abutted together to form a seamless second color filter block.

In the OLED display panel of the embodiment of the present disclosure, the color filter elements of the subpixels of the same color in the adjacent pixels are abutted together without black matrix between them. Therefore, the effective light transmission aperture of the subpixel is increased, and the optical diffraction and associated detrimental effects on image resolution and color gamut are minimized.

In an embodiment of a general format, the pixel array includes K kinds of seamless color filter blocks in K kinds of different colors, wherein 1≤K≤N. Assume an average transmission wavelength of color filter elements of an i-th color is $\lambda_i$, a ranking for the N kinds of color filter elements based on their average transmission wavelengths satisfies: $\lambda_1 \geq \lambda_2 \geq \ldots \geq \lambda_K \geq \lambda_{K+1} \geq \ldots \geq \lambda_N$, where the subscripts i, K and N are positive integers and 1≤i≤N.

Because the color filter blocks have relatively large apertures for light in longer wavelengths, the optical diffraction is reduced and the associated detrimental effects on image resolution and color gamut are reduced as well.

The relevant descriptions and analysis in the embodiments as described above are specific embodiments for a typical chromaticity space of three primary colors RGB. The same concept is also applicable to other chromaticity spaces, such as a chromaticity space constructed by supplementary colors of the three primary colors RGB, which is commonly used in the dye industry, i.e., CMYK chromaticity coordinates. Specifically, the CMYK chromaticity space is constructed by cyan (CYAN), yellow (YELLOW), magenta (MAGENTA) and black, and a CMY chromaticity system will be formed if the chromaticity coordinates of a black dye is removed from the electronic display screen. In the RGB chromaticity coordinates, CYAN=G128+B128, MAGENTA=R228+B127, and YELLOW=R247+G171. These relationships also represent a mapping from the RGB chromaticity space to the CMY chromaticity space. Among the supplementary colors of RGB, the magenta color is a mixture of most of the red color and a small part of the blue color and has a longest average wavelength, the cyan color is a mixture of a half of the green color and a half of the blue color and has a shortest average wavelength, and the yellow color has a moderate average wavelength. In fact, there are few pure red, green, and blue colors in the nature, and most of the colors are the supplementary colors of the three primary colors of red, green, and blue, and the supplementary colors include cyan, magenta, yellow, and a mixture thereof (also known as intermediate colors). Among these supplementary colors, the yellow color occupies a considerable component. Furthermore, in existing broadcast television signals, yellow signals appear at a high frequency in addition to cyan signals. Therefore, when considering various types of light of different colors in the nature, the subpixels in which every two adjacent color filter elements are abutted together to form a seamless color filter block are not limited to the red subpixels. Thus, in the following embodiments, a description will be set forth in which a composition of the subpixels in the pixel are constructed according to different chromaticity spaces.

When the subpixels of the display panel are in the chromaticity space of the three primary colors RGB, then in the pixel, the red subpixel is denoted by R, the green subpixel is denoted by G, and the blue subpixel is denoted by B. In addition, when the subpixels of the display panel are in the CMY chromaticity space of supplementary colors of the three primary colors RGB, then in the pixel, the cyan subpixel is denoted by C, the yellow subpixel is denoted by Y, and the magenta subpixel is denoted by M. Further, subscripts are used to distinguish different pixels. For example, $R_1$ represents a red subpixel of the first pixels in the RGB chromaticity space, $R_2$ represents a red subpixel of the second pixels in the RGB chromaticity space, $C_1$ represents a cyan subpixel of the first subpixels in the chromaticity space of supplementary colors of RGB, and $C_2$ represents a cyan subpixel of the second subpixels in the chromaticity space of supplementary colors of RGB. The arrangements of the subpixels in different pixels when the subpixels are in different chromaticity spaces will be described below.

In an embodiment, with continued reference to FIG. 5, the color filter elements include red color filter elements, green color filter elements and blue color filter elements.

Figure 6:
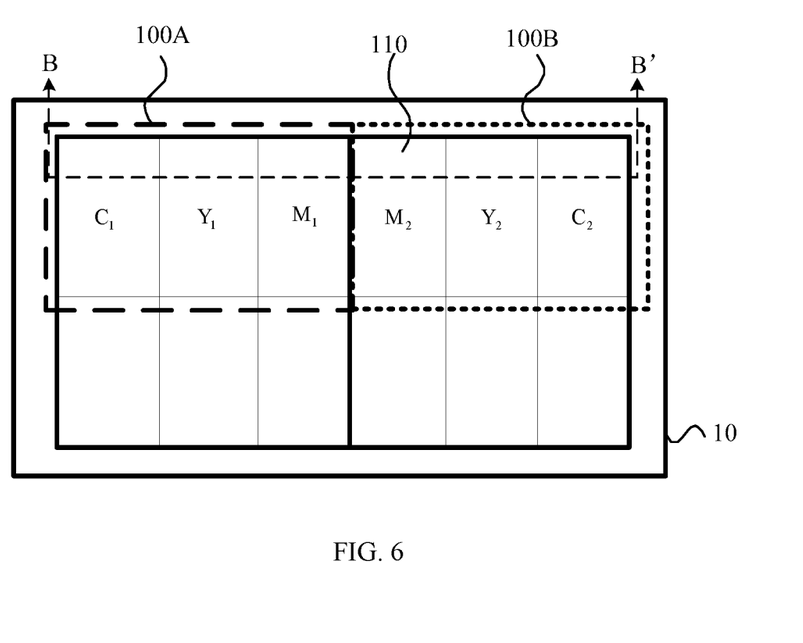
FIG. 6 illustrates a pixel layout of another OLED display panel according to an embodiment of the present disclosure.
Figure 7:
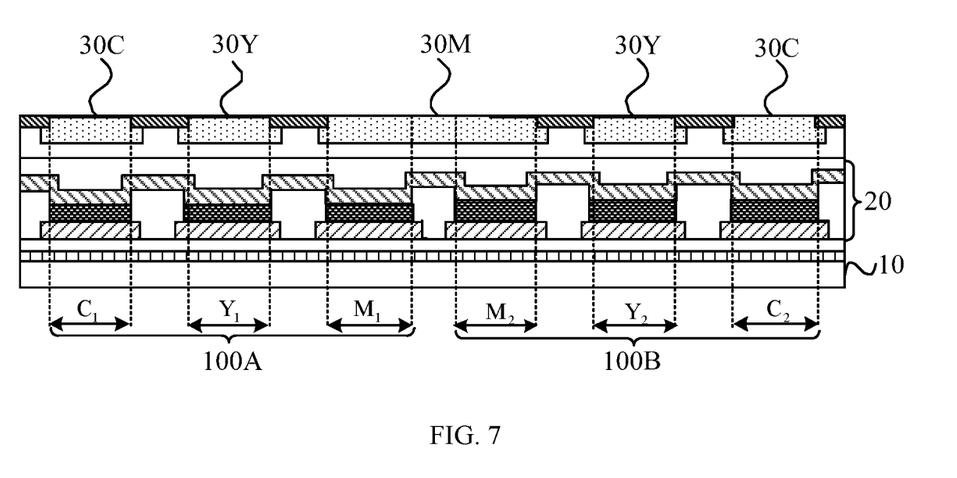
FIG. 7 illustrates a cross-sectional view along line B-B' as shown in FIG. 6.

On the basis of the embodiments as described above, FIG. 6 illustrates a pixel layout of another OLED display panel according to an embodiment of the present disclosure, and FIG. 7 illustrates a cross-sectional view along line B-B' as shown in FIG. 6. As shown in FIGS. 6 and 7, the color filter elements include cyan color filter elements, magenta color filter elements and yellow color filter elements.

When the pixels include red, green and blue subpixels in the chromaticity space of the three primary colors RGB, as shown in FIG. 5, the color filter elements include red color filter elements that transmit visible light with a spectral band from 590 nm to 780 nm, green color filter elements that transmit visible light with a spectral band from 495 nm to 590 nm, and blue color filter elements that transmit visible light with a spectral band from 430 nm to 495 nm. When the pixels include cyan, magenta, and yellow subpixels in the chromaticity space constructed by supplementary colors of the three primary colors RGB, as shown in FIGS. 6 and 7, the color filter elements in the pixel array include cyan color filter elements 30C, magenta color filter elements 30M and yellow color filter elements 30Y. Each of the pixels 100A includes a cyan subpixel $C_1$, a yellow subpixel $Y_1$ and a magenta subpixel $M_1$, and each of the pixels 100B includes a cyan subpixel $C_2$, a yellow subpixel $Y_2$ and a magenta subpixel $M_2$. Further, color filter elements of magenta subpixels in two adjacent pixels are merged together, i.e., the color filter element of the magenta subpixel $M_1$ and the color filter element of the magenta subpixel $M_2$ are merged together.

Figure 8:
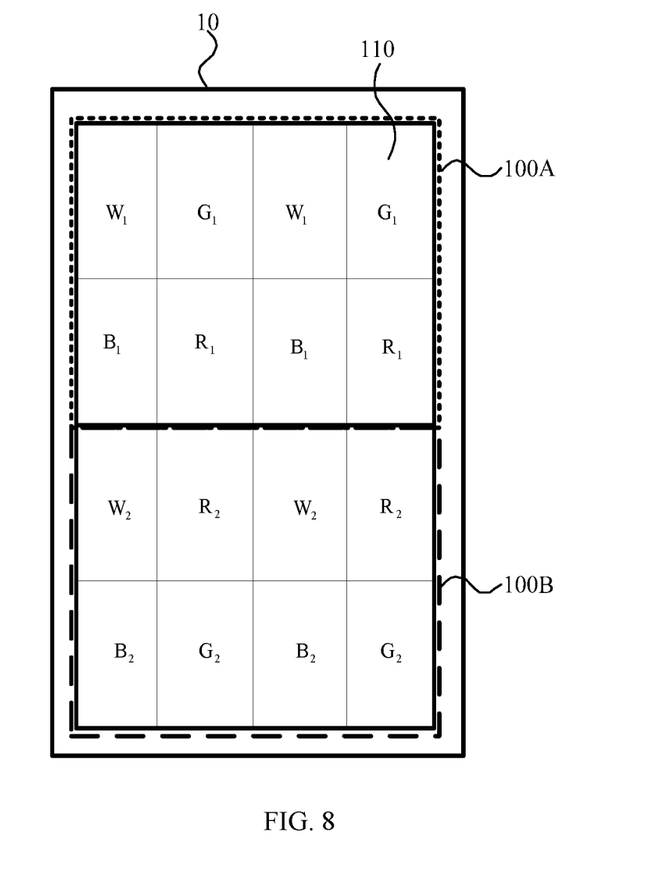
FIG. 8 illustrates a pixel layout of a further another OLED display panel according to an embodiment of the present disclosure.

On the basis of the embodiments as described above, FIG. 8 illustrates a pixel layout of a further another OLED display panel according to an embodiment of the present disclosure. As shown in FIG. 8, the color filter elements further include white color filter elements which are made approximately transparent to white light (i.e., all visible light), but non-transparent to infrared light and ultraviolet light.

When the color filter elements include the white color filter elements, as shown in FIG. 8, each of the pixels 100A includes a red subpixel $R_1$, a green subpixel $G_1$, a blue subpixel $B_1$ and a white subpixel $W_1$, and each of the pixels 100B includes a red subpixel $R_2$, a green subpixel $G_2$, a blue subpixel and a white subpixel $W_2$. Further, light-emitting elements of red subpixels of two adjacent pixels 100A and 100B share one seamless color filter block.

Figure 9:
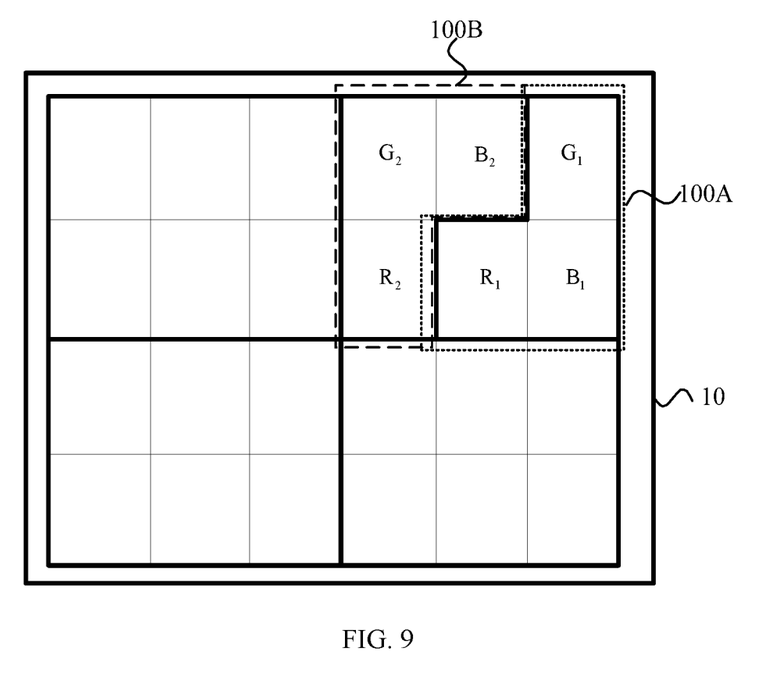
FIG. 9 illustrates a pixel layout of still another OLED display panel according to an embodiment of the present disclosure.

On the basis of the embodiments as described above, FIG. 9 illustrates a pixel layout of still another OLED display panel according to an embodiment of the present disclosure. As shown in FIG. 9, each of the subpixels is in a quadrilateral shape. Further, a direction in which rows of subpixels in the pixel array extend is parallel to a first side of each subpixel, a direction in which columns of subpixels in the pixel array extend is parallel to a second side of each subpixel, and the first side and the second side of each subpixel intersects with each other.

As shown in FIG. 9, when each of the subpixels is in the quadrilateral shape, red subpixels in two adjacent pixels are adjacent to each other. Further, in one and the same pixel, the green subpixel and the blue subpixel surround the red subpixel; and in two adjacent pixels, the green subpixels is not adjacent to each other, and the blue subpixels are not adjacent to each other.

Figure 10:
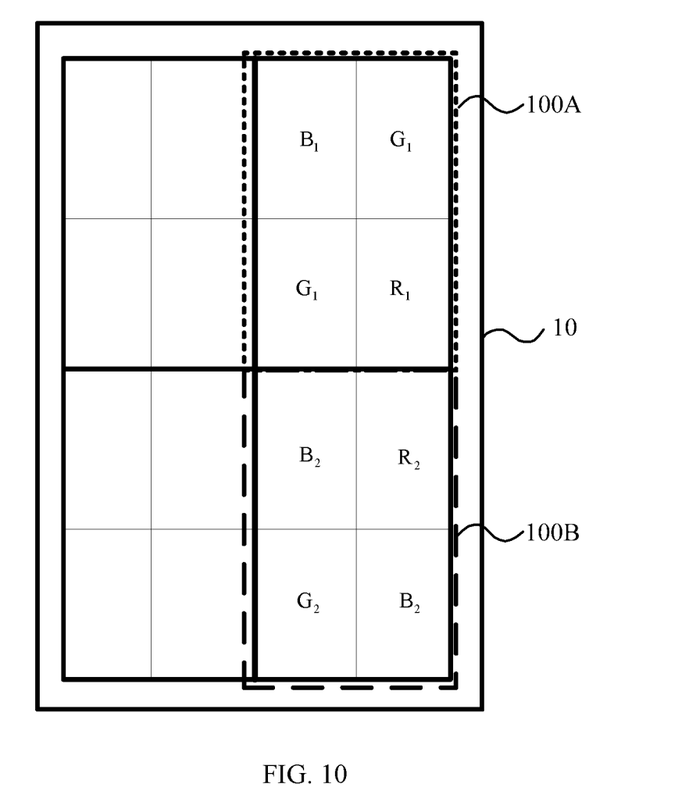
FIG. 10 illustrates a pixel layout of still another OLED display panel according to an embodiment of the present disclosure.
Figure 11:
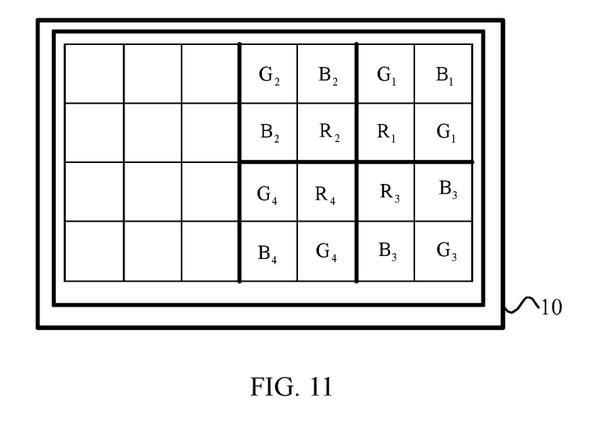
FIG. 11 illustrates a pixel layout of still another OLED display panel according to an embodiment of the present disclosure.
Figure 12:
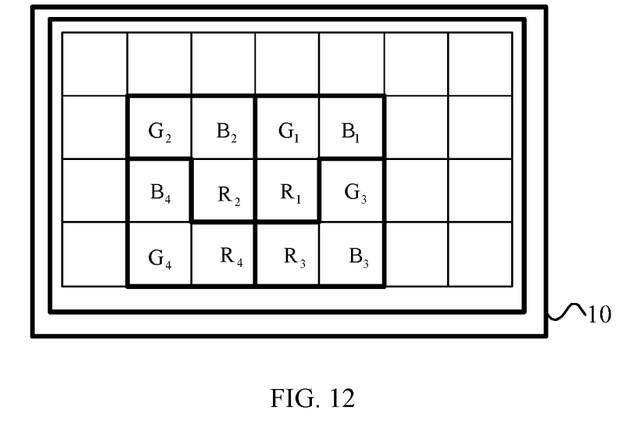
FIG. 12 illustrates a pixel layout of still another OLED display panel according to an embodiment of the present disclosure.
Figure 13:
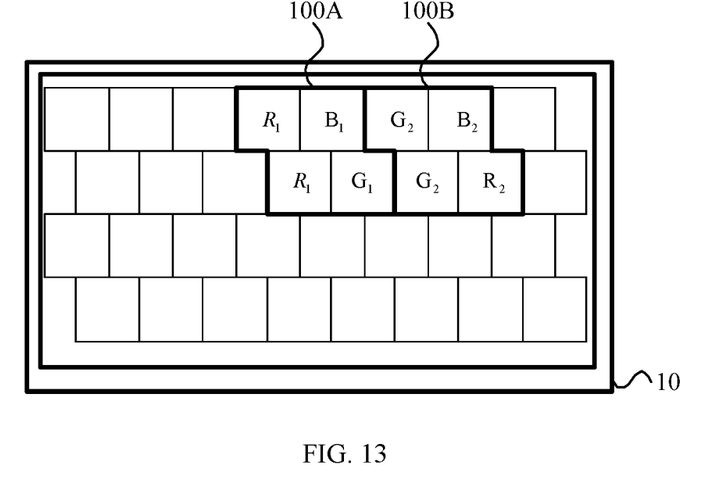
FIG. 13 illustrates a pixel layout of still another OLED display panel according to an embodiment of the present disclosure.

It should be noted that FIG. 9 illustrates an arrangement of the adjacent subpixels when the subpixels are in the quadrilateral shape. However, the adjacent subpixels may be arranged in other manners. As shown in FIGS. 10, 11 and 12, a direction in which the subpixel columns of the pixel array extend (i.e., subpixel column direction) is perpendicular to a direction in which the rows of the pixel array extend (i.e., subpixel row direction). Alternatively, as shown in FIG. 13, the subpixel column direction of the pixel array is not perpendicular to the subpixel row direction of the pixel array. Instead, two adjacent rows of subpixels are offset with each other by a sampling space of a half-length of one subpixel in the row direction, which equivalently doubles a sampling density in a horizontal direction, thereby suppressing Moore interference stripe to a certain extent.

Figure 14:
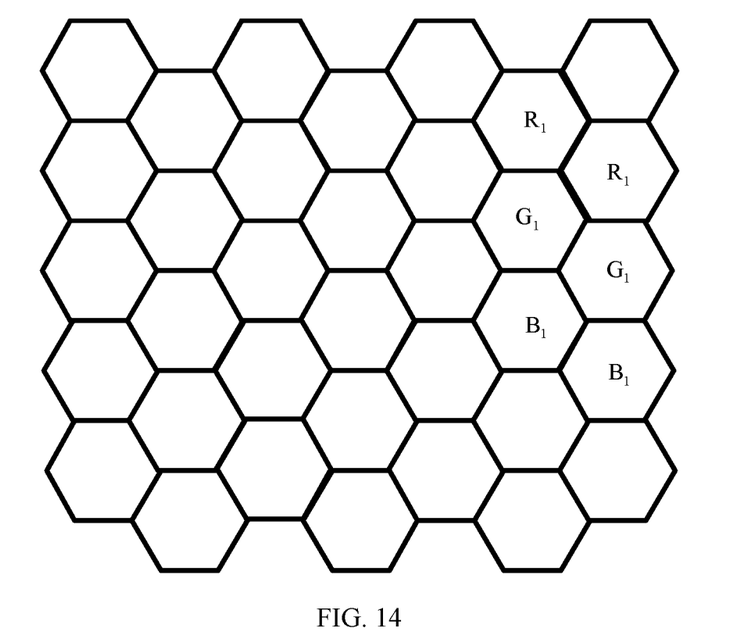
FIG. 14 illustrates a pixel layout of still another OLED display panel according to an embodiment of the present disclosure.

On the basis of the embodiments as described above, FIG. 14 illustrates a pixel layout of still another OLED display panel according to an embodiment of the present disclosure. As shown in FIG. 14, each of the subpixels is in a regular hexagon shape, and the subpixels in the pixel array are arranged in a honeycomb shape.

As shown in FIG. 14, because each of the subpixels is in the regular hexagon shape and the subpixels in the pixel array are arranged in the honeycomb pattern, a boundary between the subpixels occupies the smallest area, so that that the subpixels have a higher aperture ratio and improving the extraction rate of the light emitted by the light-emitting elements (i.e., the light source).

Figure 15:
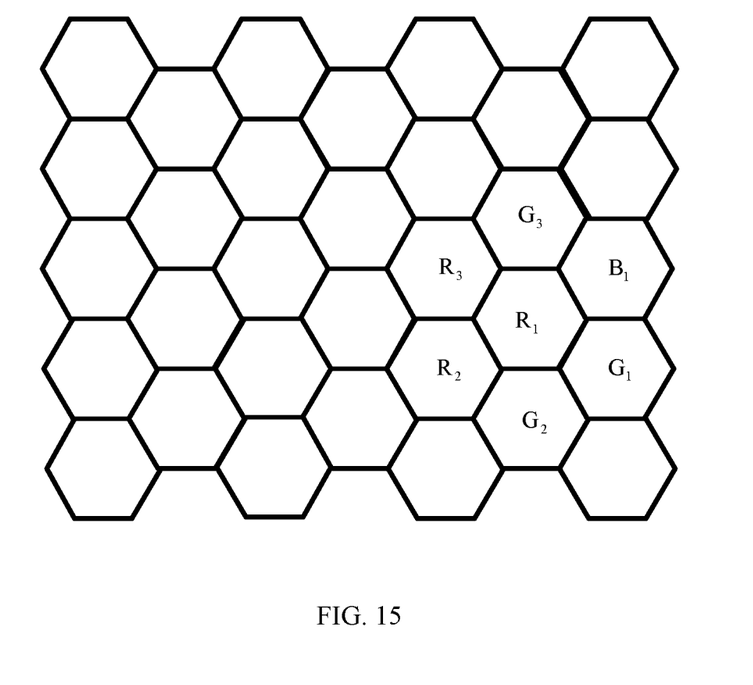
FIG. 15 illustrates a pixel layout of still another OLED display panel according to an embodiment of the present disclosure.
Figure 16:
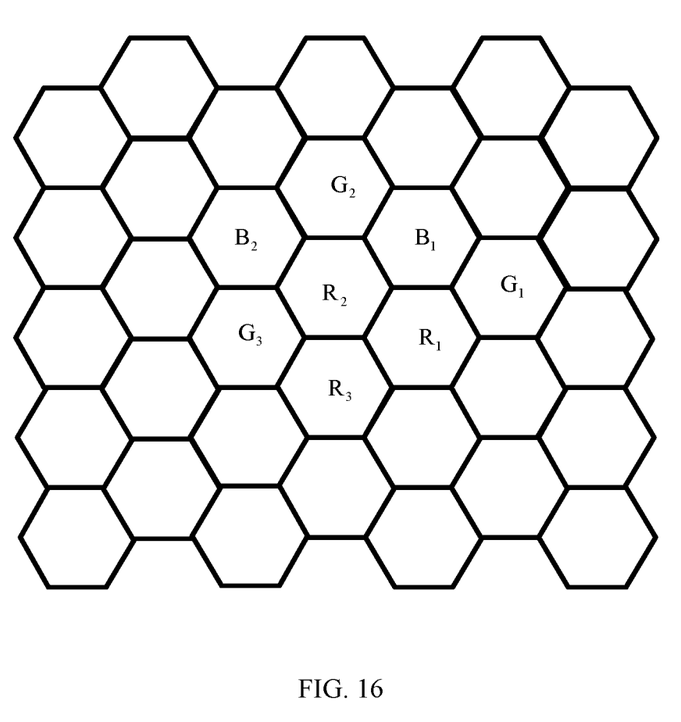
FIG. 16 illustrates a pixel layout of still another OLED display panel according to an embodiment of the present disclosure.
Figure 17:
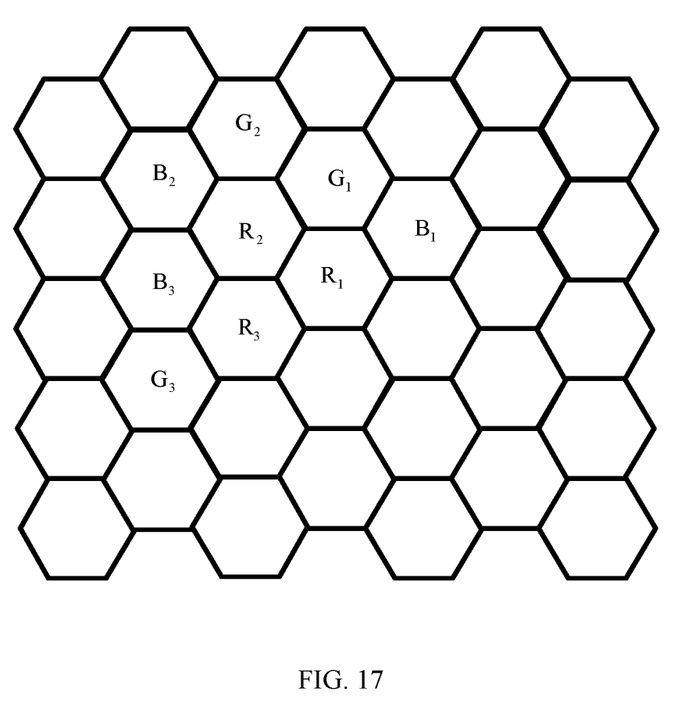
FIG. 17 illustrates a pixel layout of still another OLED display panel according to an embodiment of the present disclosure.

It should be noted that FIG. 14 exemplarily illustrates an example in which each of the subpixels is in a regular hexagon shape, and the subpixels of the pixel array are arranged in a honeycomb pattern. Alternatively, when the subpixels are in the regular hexagon shape, the subpixels of the pixel array may be arranged in other honeycomb patterns as shown in FIGS. 15 to 17.

In an embodiment, average wavelengths of transmission spectra of the color filter elements of three different colors are $\lambda_1$, $\lambda_2$ and $\lambda_3$, where $\lambda_1 \geq \lambda_2 \geq \lambda_3$, and the number of light-emitting elements covered by the color filter elements of a first color with the average wavelength of $\lambda_1$ is $P_1$, the number of light-emitting elements covered by the color filter elements of a second color with the average wavelength of $\lambda_2$ is $P_2$, and the number of light-emitting elements covered by the color filter elements of a third color with the average wavelength of $\lambda_3$ is $P_3$. $P_1:P_2:P_3$ is 2:2:2, 2:3:3, 3:3:1, 3:3:2, 3:3:3, 4:4:4 or 4:6:6.

In an embodiment, as shown in FIGS. 9 and 14, $P_1:P_2:P_3$ is 2:2:2.

Alternatively, as shown in FIG. 10, $P_1:P_2:P_3$ is 2:2:3.

Alternatively, as shown in FIG. 15, $P_1:P_2:P_3$ is 3:3:1.

Alternatively, as shown in FIGS. 13 and 16, $P_1:P_2:P_3$ is 3:3:2.

Alternatively, as shown in FIG. 16, $P_1:P_2:P_3$ is 3:3:3.

Alternatively, as shown in FIG. 11, $P_1:P_2:P_3$ is 4:4:4.

Alternatively, as shown in FIG. 12, $P_1:P_2:P_3$ is 4:6:6.

It should be noted that FIGS. 9-17 exemplarily illustrate the embodiments of the present disclosure in which the color filter elements include the red, green and blue color filter elements, the color filter elements with the wavelength of $\lambda_1$ are the red color filter elements, the color filter elements with the wavelength of $\lambda_2$ are the green color filter elements, and the color filter elements with the wavelength of $\lambda_3$ are the blue color filter elements. When the color filter elements include cyan, magenta and yellow color filter elements, the ratio of the numbers of light-emitting elements covered by color filter elements of the respective colors is the same as that when the color filter elements include the red, green and blue color filter elements, the description of which is not repeated here.

Further, the ratio of the numbers of light-emitting elements covered by the color filter elements of the respective colors with the average wavelengths of $\lambda_1$, $\lambda_2$ and $\lambda_3$ may be other values, as long as the light-emitting elements of adjacent pixels are adjacent to each other and share one seamless color filter block of the same color, thereby reducing the optical diffraction occurring in the subpixels and the detrimental effect thereof on the display effect of the display panel.

In an embodiment, with continued reference to FIG. 10, the number of subpixels of each color is negatively correlated with the average wavelength of the transmission spectrum of the color filter elements that cover the light-emitting elements of the subpixels of the color.

According to optical diffraction theory, when the number of subpixels of a color decreases with the increase of the average wavelength of the transmission spectrum of the color filter elements that cover the light-emitting elements of the subpixels of the color, the optical diffraction may be further suppressed to obtain a higher spatial resolution. Therefore, when the subpixels include the red, green and blue subpixels, the number of the red subpixels is the smallest, thereby reducing the influence of the optical diffraction occurring in the red subpixels on the display effect of the display panel. Further, in order to compensate for the greenish or bluish color deviation of the screen due to fewer red subpixels, a white balance of the images may be re-obtained by appropriately increasing the brightness of the red subpixels and reducing the brightness of the green or blue subpixels. According to a visual response curve of the human eyes, the green light has the highest responsivity. Therefore, in the pixel array of the display panel shown in FIG. 11, it is completely feasible to appropriately reduce the brightness of the green subpixels.

In an embodiment, with continued reference to FIG. 5, the OLED display panel further includes a black matrix 40 located at a side of the light-emitting elements 20 facing away from the substrate 10 and formed with a plurality of openings 41. An orthographic projection of each of the openings 41 on the substrate 10 overlaps with an orthographic projection of the corresponding subpixel 110 on the substrate 10.

In this embodiment, because the black matrix 40 is formed with the openings 41, and the orthographic projection of each opening 41 on the substrate 10 overlaps with an orthographic projection of the corresponding subpixel 110 on the substrate 10, it is possible to reduce the diffraction occurring in the subpixels of the respective colors when light emitted from the subpixels passes through the color filter elements by changing sizes of the openings 41 in the black matrix 40.

It should be noted that, in the above descriptions, each of the openings of the black matrix 50 is treated as circular aperture, in which Fraunhofer circular aperture diffraction occurs. However, other geometric shapes of the openings of the black matrix are feasible as well. In addition, a black matrix can be formed by superimposing two adjacent color filters in different color bands along their border, so as to block all visible light. Therefore, in all of the drawings of the present disclosure, the black matrix mentioned in the description and claims represents any structure or material constituting the structure defining light passing windows. Phrases such as "opening of the black matrix", "light transmission aperture", and "light transmission area" represent the light passing windows equivalently.

An embodiment of the present disclosure provides a display apparatus including the OLED display panel according to any one of the embodiments as described above. It should be noted that the display apparatus of the embodiment of the present disclosure may be a computer monitor, a television screen, a smart wearable display or the like, including circuits and devices to support a normal operation of the display apparatus.

It should be noted that the foregoing embodiments are merely some preferred embodiments of the present disclosure, based on the disclosed technical concept. It should be understood by those skilled in the art that the present disclosure is not limited to the specific embodiments described herein, and various modifications, combinations and substitutions may be made by those skilled in the art without departing from the scope of the present disclosure. Therefore, although the present disclosure has been described with reference to the embodiments herein, the present disclosure is not limited thereto, many other embodiments may be derived without departing from the technical concept of the present disclosure, and the scope of the present disclosure is defined by the appended claims.

What is claimed is:

1. An OLED display panel, comprising:
   a substrate; and
   a pixel array comprising a plurality of pixels located on the substrate,
   wherein each of the plurality of pixels comprises a group of N subpixels representing N kinds of colors, respectively, and each subpixel comprises a light-emitting element and a color filter element covering the light-emitting element, and
   wherein the pixel array comprises a plurality of pixel clusters, and each pixel cluster of the plurality of pixel clusters is formed by tiling M adjacent pixels in a manner that M subpixels from the M adjacent pixels, respectively, share a seamless color filter block, where $2 \leq M \leq N$, and the seamless color filter block is in a same color without an inner boundary.

2. The OLED display panel according to claim 1, wherein the N colors comprise red, green and blue.

3. The OLED display panel according to claim 1, wherein the N colors comprise cyan, magenta and yellow.

4. The OLED display panel according to claim 1, wherein the N kinds of color filter elements further comprise color filter elements that are transparent to all visible light.

5. The OLED display panel according to claim 1, wherein each of the subpixels is in a quadrilateral shape,
   wherein each subpixel has a first side that is parallel to a direction in which rows of the subpixels in the pixel array extend, and a second side that is parallel to a direction in which columns of the subpixels in the pixel array extend, wherein the first side intersects with the second side.

6. The OLED display panel according to claim 1, wherein each of the subpixels is in a regular hexagon shape, and the subpixels in the pixel array are arranged in a honeycomb pattern.

7. The OLED display panel according to claim 1, wherein a number of light-emitting elements covered by the color filter elements with the average wavelength of $\lambda_1$ is $P_1$, a number of light-emitting elements covered by the color filter elements with the average wavelength of $\lambda_2$ is $P_2$, and a number of light-emitting elements covered by the color filter elements with the average wavelength of $\lambda_3$ is $P_3$, where $P_1:P_2:P_3$ is 2:2:2, 2:3:3, 3:3:1, 3:3:2, 3:3:3, 4:4:4 or 4:6:6.

8. The OLED display panel according to claim 1, further comprising a black matrix located at a side of light-emitting elements of the subpixels facing away from the substrate and formed with a plurality of openings,
   wherein an orthographic projection of each of the plurality of opening on the substrate overlaps with an orthographic projection of a respective subpixel of the subpixels on the substrate.

9. A display apparatus, comprising the OLED display panel according to claim 1.

* * * * *